(12) United States Patent
Young et al.

(10) Patent No.: US 9,093,666 B2
(45) Date of Patent: Jul. 28, 2015

(54) LIGHT-EMITTING DEVICE AND METHOD FOR MANUFACTURING THE SAME

(75) Inventors: Edward Willem Albert Young, Maastricht (NL); Joanne Sarah Wilson, Dordrecht (NL); Stephan Harkema, Eindhoven (NL); Dorothee Christine Hermes, Herten (NL); Jasper Joost Michels, 's-Hertogenbosch (NL); Antonius Maria Bernardus van Mol, Eindhoven (NL); Emilie Galand, Saint Louis la Chaussee (FR); Richard Frantz, Village Neuf (FR); Dimiter Lubomirov Kotzev, Basel (CH)

(73) Assignees: Nederlandse Organisatie voor toegepast-natuurwetenschappelijk Onderzoek TNO, Delft (NL); Huntsman Advanced Materials (Switzerland) GmbH, Basel (CH)

(*) Notice: Subject to any disclaimer, the term of this patent is extended or adjusted under 35 U.S.C. 154(b) by 96 days.

(21) Appl. No.: 13/643,153

(22) PCT Filed: Apr. 29, 2011

(86) PCT No.: PCT/NL2011/050294
§ 371 (c)(1),
(2), (4) Date: Apr. 25, 2013

(87) PCT Pub. No.: WO2011/136653
PCT Pub. Date: Nov. 3, 2011

(65) Prior Publication Data
US 2013/0207083 A1    Aug. 15, 2013

(30) Foreign Application Priority Data

Apr. 29, 2010 (EP) .................................... 10161526

(51) Int. Cl.
*H01L 33/58* (2010.01)
*H01L 51/56* (2006.01)
*H01L 51/52* (2006.01)

(52) U.S. Cl.
CPC ........ *H01L 51/5275* (2013.01); *H01L 51/5237* (2013.01); *H01L 51/5246* (2013.01); *H01L 51/5253* (2013.01)

(58) Field of Classification Search
CPC ............ H01L 51/5246; H01L 51/5275; H01L 51/5253
USPC ................ 257/40, 79, 98, 100, 222, E33.074, 257/E51.018; 313/503, 504, 506, 512; 438/27, 29, 150, 164
See application file for complete search history.

(56) References Cited

U.S. PATENT DOCUMENTS 6,965,197 B2    11/2005  Tyan
7,109,651 B2    9/2006   Nakamura
(Continued)

FOREIGN PATENT DOCUMENTS

CN    1665361 A    9/2005
CN    101218659 A  7/2008
(Continued)

OTHER PUBLICATIONS

Arévalo, et al. (2005) "Epoxy/poly(benzyl methacrylate) blends: miscibility, phase separation on curing and morphology", in Proceedings of the 8th Polymers for Advanced Technologies International Symposium, Budapest, Hungary, Sep. 13-16, 2005.
(Continued)

*Primary Examiner* — Dao H Nguyen
(74) *Attorney, Agent, or Firm* — Swanson & Bratschun, L.L.C.

(57) ABSTRACT

A light-emitting device is disclosed comprising an organic light-emitting diode structure and an encapsulation comprising a light-transmitting window with at least a first inorganic layer, an organic layer and a second inorganic layer, the organic layer comprising domains of a dispersed first organic component embedded by a second component, the first and the second component having a mutually different refractive index, the organic layer being sandwiched between the first and the second inorganic layer.

7 Claims, 9 Drawing Sheets

(56) References Cited

U.S. PATENT DOCUMENTS

| | | |
|---|---|---|
| 7,198,832 B2 | 4/2007 | Burrows |
| 2001/0026124 A1 | 10/2001 | Liu |
| 2003/0124392 A1 | 7/2003 | Bright |
| 2003/0127973 A1 | 7/2003 | Weaver |
| 2003/0222576 A1 | 12/2003 | Lu |
| 2003/0222577 A1 | 12/2003 | Lu |
| 2004/0195960 A1* | 10/2004 | Czeremuszkin et al. ...... 313/504 |
| 2005/0023974 A1* | 2/2005 | Chwang et al. .............. 313/512 |
| 2005/0062407 A1 | 3/2005 | Suh |
| 2005/0093001 A1 | 5/2005 | Liu |
| 2005/0142379 A1* | 6/2005 | Juni et al. ...................... 428/690 |
| 2005/0194896 A1 | 9/2005 | Sugita |
| 2006/0054887 A1 | 3/2006 | Kim |
| 2006/0102913 A1 | 5/2006 | Park |
| 2007/0096634 A1 | 5/2007 | Krummacher |
| 2007/0200492 A1 | 8/2007 | Cok |
| 2007/0201056 A1 | 8/2007 | Cok |
| 2008/0116784 A1 | 5/2008 | Krummacher |
| 2008/0284313 A1 | 11/2008 | Berben |
| 2009/0302744 A1* | 12/2009 | Kim et al. ...................... 313/504 |
| 2010/0156765 A1* | 6/2010 | Park et al. ........................ 345/77 |
| 2012/0256218 A1* | 10/2012 | Kwack et al. ................... 257/98 |
| 2013/0248828 A1* | 9/2013 | Schaepkens et al. ........... 257/40 |
| 2014/0049825 A1* | 2/2014 | van Mol et al. .............. 359/513 |
| 2014/0179040 A1* | 6/2014 | Ramadas et al. ................ 438/27 |

FOREIGN PATENT DOCUMENTS

| | | |
|---|---|---|
| EP | 0488374 | 6/1992 |
| EP | 2091096 | 8/2009 |
| JP | 2000-267086 | 9/2000 |
| JP | 2006-196197 | 7/2006 |
| JP | 2013-525551 | 6/2013 |
| WO | WO 2004/084323 | 9/2004 |
| WO | WO 2005/114762 | 12/2005 |
| WO | WO 2006/040704 | 4/2006 |

OTHER PUBLICATIONS

Bathelt, et al. (2007) Organic Electronics 8, pp. 293-299, "Light extraction from OLEDs for lighting applications through light scattering".
International Search Report, from PCT/NL2011/050294, dated Aug. 8, 2011.
Duggal, et al. (2002) Applied Physics Letters 80(19):3470-3472 "Organic light-emitting devices for illumination quality white light".
Duggal, et al. (2005) SID 05 Digest, p. 28-31 "4.1: Invited Paper: Large Area White OLEDs".
Ishihara, et al. (2007) Applied Physics Letters 90:111114-1-111114-3, "Organic light-emitting diodes with photonic crystals on glass substrate fabricated by nanoimprint lithography".
Ji, et al. (2008) Optics Express 16(20):15489-15494, "Top-emitting white organic light-emitting devices with down-conversion phosphors: Theory and experiment".
Kim, et al. (2006) Applied Physics Letters 89:173502-1-173502-3, "Planarized SiNx/spin-on-glass photonic crystal organic light-emitting diodes".
Krummacher, et al. (2006) Applied Physics Letters 88:113506-1-113506-3, "Highly efficient white organic light-emitting diode".
Lee, et al. (2003) Applied Physics Letters 82(21):3779-3781, "A high-extraction-efficiency nanopatterned organic light-emitting diode".
Li, et al. (2007) Japanese Journal of Applied Physics 46(11):7487-7489. "Low-voltage Driving Three-Peak White Organic Light Emitting Diodes with Color Conversion Hole Injection Layer Based on Hose-Guest Energy Transfer".
Li, et al. (2007) Optics Express 15(22):608-615, "A highly color-stability white organic light-emitting diode by color conversion within hole injection layer".
Li, et al. (2007) Optics Express 15(22):14422-14430, "Study of color-conversion-materials in chromatic-stability white organic light-emitting diodes".
Lu and Strum (2002) Journal of Applied Physics 91(2):595-604, "Optimization of external coupling and light emission in organic light-emitting devices: modeling and experiment".
Madigan, et al. (2000) Applied Physics Letters 76(13):1650-1652, "Improvement of output coupling efficiency of organic light-emitting diodes by backside substrate modification".
Matterson, et al. (2001) Advanced Materials 13(2):123-127, "Increased Efficiency and Controlled Light Output from a Microstructured Light-Emitting Diode".
Melpignano, et al. (2006) Applied Physics Letters 88:153514-1-153514-3, "Efficient light extraction and beam shaping from flexible, optically integrated organic light-emitting diodes".
Moller and Forrest (2002) Journal of Applied Physics 91(5):3324-3327, "Improved light out-coupling in organic light emitting diodes employing ordered microlens arrays".
Neyts (2005) Applied Surface Science 244:517-523, "Microcavity effects and the outcoupling of light in displays and lighting applications based on thin emitting films".
Riel, et al. (2003) Applied Physics Letters 82(3):466-468, "Phosphorescent top-emitting organic light-emitting devices with improved light outcoupling".
Zhang, et al. (2008) Journal of Luminescence 128: 67-73, "A triphenylamine derivative as an efficient organic light color-conversion material for white LEDs".
Office Action from CN 2011800212141 dated Dec. 3, 2014, with English Translation.
Office Action from JP 2013507900 dated Feb. 9, 2015 with English Translation.

\* cited by examiner

LIGHT-EMITTING DEVICE AND METHOD FOR MANUFACTURING THE SAME

RELATED APPLICATIONS

This application is a 35 U.S.C. §371 national phase application of PCT/NL2011/050294 (WO 2011/136653), filed on Apr. 29, 2011, entitled "Light-Emitting Device and Method for Manufacturing the Same", which application claims priority to European Application No. 10161526.8 filed Apr. 29, 2010, each of which is incorporated herein by reference in its entirety.

BACKGROUND OF THE INVENTION

1. Field of the Invention

The present invention relates to a light-emitting device.

The present invention further relates to a method for manufacturing a light-emitting device.

2. Related Art

Organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

OLEDs generate light when an electron and a hole combine in a light-emitting layer in the OLED to generate a photon. The percentage of combined electrons and holes that result in generation of a photon in the light-emitting layer is referred to as the "internal electroluminescence quantum efficiency." The percentage of generated photons that are transmitted or "coupled" out of the device is referred to as the "external electroluminescence quantum efficiency" or the "out-coupling" efficiency of the device. Models predict that only about 20% or less of the generated photons are transmitted out of the device. It is believed that this is at least in part due to the fact that the generated photons are trapped within the OLED device by internal reflection at interfaces within the OLED, resulting in waveguiding of the photons within the OLED and absorption of the trapped photons by the OLED. Absorption can occur within any part of the OLED device, such as within an ITO anode layer or within the substrate. Internal reflection occurs where the refractive index of that particular part is greater than the refractive indices of the adjacent parts. These phenomena result in decreased external electroluminescence quantum efficiency and a reduction in the luminescence or brightness in directions extending outwardly from the surface of the device.

US 2003127973 describes an OLED that is provided with a composite barrier layer disposed over the active region and/or on a surface of the substrate. The composite barrier layer comprises an alternating series of one or more polymeric planarizing sublayers and one or more high-density sublayers. At least one of the polymeric planarizing sublayers has microparticles incorporated therein. This includes preferably the polymeric planarizing sublayer closest to the active region. The microparticles are effective to increase the out-coupling efficiency of the OLED. The microparticles are preferably comprised of a transparent material, preferably an inorganic material such as a metal, metal oxide, e.g., TiO2, or other ceramic material having a relatively high index of refraction, preferably, the microparticles will have an index of refraction of greater than about 1.7. The microparticles are preferably substantially smaller than the largest dimension of any active region or pixel in a display comprising an OLED device of the invention. The microparticles preferably will have a size greater than the wavelength $\lambda$, of light generated by the OLED. Thus, the microparticles will preferably have a particle size greater than about 0.4 µm-0.7 µm. The microparticles will preferably have a size in the range of from about 0.4 µm to about 10 µm or greater. The presence of the microparticles reduces the planarizing effect of the planarizing layer.

It is noted that US2009/302744 A1 discloses an OLED device and a manufacturing method thereof. Organic light emission diode elements are disposed on a substrate. On the substrate with the organic light emission diode elements, a sealant layer having a micro-lens portion is disposed, thereby shielding the organic light emission diode elements from external moisture and/or oxygen. The sealant layer is formed of a pre-composition that includes a liquid pre-polymer. In an embodiment the sealant layer is sandwiched between two auxiliary sealant layers. An auxiliary sealant layer can be one of a silicon oxide film and a silicon nitride, or a stacked layer thereof.

It is further noted that US2005 194896 A1 discloses light-emitting device with a light extraction layer formed by a transparent medium dispersed with a fine transparent substance whose refractive index differs from that of the transparent medium.

SUMMARY OF THE INVENTION

It is an object of the invention to at least partially overcome the disadvantages of the prior art.

According to a first aspect of the invention there is provided a light-emitting device comprising
  an organic light-emitting diode structure,
  an encapsulation comprising a light-transmitting window with at least a first inorganic layer, an organic layer and a second inorganic layer, the organic layer comprising domains of a dispersed first organic component embedded by a second component, the first and the second component having a mutually different refractive index, the organic layer being sandwiched between the first and the second inorganic layer.

According to a second aspect of the invention there is provided a method for manufacturing a light-emitting device, comprising the steps of
  providing a light-emitting structure,
  providing an encapsulation comprising the step of providing a light-transmitting window by
    providing at least a first inorganic layer,
    providing an organic layer composed of at least a first and a second organic component having a mutually different refractive index, wherein the at least first component is dispersed as domains that are embedded by the at least second component in the composite organic layer,
    curing the organic layer and
    providing a second inorganic layer.

The device and method as claimed are non-obvious in view of the following arguments.

As the OLED device known from US2009/0302744 already has a layer with micro-lens portions that is intended to improve light-output efficiency, the skilled person in this field has no incentive to apply a light extraction layer as disclosed in US2005/194896.

Moreover, according to §218, 219 of the latter patent publication, the structure of the light extraction layer has the effect that light is scattered. US2009/0302744 on the contrary aims to avoid a blurring phenomenon. See for example §50, 51, 55. Accordingly these patent publications have a mutually conflicting teaching therewith discouraging the skilled person to apply the light extraction layer of US2005/194896 to the device of US2009/0302744.

The organic layer typically has a thickness between 5 and 200 μm. The inorganic layers are in practice substantially thinner than the organic layers. An organic layer substantially thinner than 5 μm, e.g. 1 μm does not provide for a sufficient planarization. An organic layer substantially thicker than 200 μm, e.g. thicker than 500 μm may result in an unnecessary absorption of radiation. The inorganic layers typically have a thickness in the range of 100 to 300 nm. An inorganic layer substantially thinner than 100 nm, e.g. smaller than 10 nm would require deposition of the inorganic layer with a high density, which necessitates dedicated deposition techniques. Deposition of an inorganic layer substantially thicker than 300 nm, e.g. thicker than 1000 nm would require an unnecessary long deposition time as it provides no significant improvement of the functionality of the barrier structure. Moreover, a thick inorganic layer is unfavorable for the translucence of the barrier structure.

An organic layer having dispersed domains of a first component that are embedded by a second component may be obtained by preparing a dispersion of at least first liquid organic substance into at least a second liquid organic substance, which liquid organic substances are mutually immiscible and applying the dispersion at the at least a first inorganic layer. Immiscible organic substances are considered to be organic substances that substantially do not dissolve into each other. In this embodiment of the method the first organic substance is dispersed in the second organic substance, for example by stirring, before it is applied at the inorganic layer. This has the advantage that the average size of the domains formed by the first component and therewith the optical properties of the organic layer can be controlled when forming the dispersion. The two mutually immiscible substances in the organic layer may include a polar organic substance and a non-polar substance. In addition two or more organic substances may be present in the composition used for providing the organic layer.

In another embodiment of the method the step of curing the organic layer causes a phase separation resulting in formation of the domains of the first component embedded by the second component. In that case the organic substances used for preparing the organic layer may be mutually miscible. This has the advantage that they can be prepared as a stable mixture that is immediately available for use in the manufacturing process. The mixture may even be stored in the printing unit used for applying the organic layer, therewith avoiding the necessity to clean the printing unit when not in use. An example of such mutually miscible substances result in formation of domains of mutually different phases upon curing is described by E. Arevalo et al. "Epoxy/poly(benzyl methacrylate) blends: miscibility, phase separation on curing and morphology", in Proceedings of the 8th Polymers for Advanced Technologies International Symposium, Budapest, Hungary, 13-16 Sep. 2005.

The organic layer comprising domains of a dispersed first organic component embedded by a second component, the first and the second component having a mutually different refractive index causes radiation emanating from the organic light-emitting diode structure to be refracted at the interfaces of these components. Radiation that otherwise would be reflected by total internal reflection is now distributed over a range of angles, so that it can escape at least partly through the light-transmitting window. Use of this organic layer has resulted in enhancements in the OLED-output as large as 40%. The enhancement by application of an organic layer provided with scattering particles is limited to about 25%, see for example R. Bathelt et al. Organic Electronics 8 (2007), p.p. 293-299.

It is furthermore an advantage that the dispersion can be applied in liquid form due to the fact that the substances used are organic. For example the substances can be in a solved or in a molten state. Alternatively liquid organic substances may be used that are subsequently cured by polymerizing for example. If desired one of the organic substances may remain in liquid form as islands in the solid sea formed by the other substance. As the dispersion can be applied in a liquid form it can be easily planarized, contrary to mixtures comprising solid particles. Additionally using the dispersion is advantageous for manufacturing processes, e.g. printing as it tends less to stick to the manufacturing machinery.

Various combinations of mutually immiscible organic materials are known as such, in particular for obtaining an improved mechanical properties, but their use as an organic layer between a pair of inorganic layers in a barrier structure for improvement of lightoutcoupling of an organic light-emitting diode has been unknown until now. For example EPO488374 discloses a composition comprising an epoxy resin and a curing agent that is blended with a thermoplastic resin impregnated with an organic silicon compound to provide an epoxy resin composition which cures into products having improved adhesion and thermal impact and is suitable for encapsulating semiconductor devices. EPO488374 observes that "the attainment of an epoxy resin composition having a high glass transition temperature, a low coefficient of expansion and high crack resistance is largely due to the fact that the epoxy-silicone resin copolymer is immiscible with the (curable) epoxy resin, but assumes a sea-island structure in the epoxy resin composition."

Suitable materials for the first and the second inorganic layers between which the organic layer composed of a dispersion of at least two mutually immiscible transparent organic substances is arranged include, but are not limited to, metal oxides, metal nitrides, metal carbides, metal oxynitrides, metal oxyborides, and combinations thereof. The metal oxides are preferably selected from silicon oxide, aluminum oxide, titanium oxide, indium oxide, tin oxide, indium tin oxide, tantalum oxide, zirconium oxide, niobium oxide, and combinations thereof. The metal nitrides are preferably selected from aluminum nitride, silicon nitride, boron nitride, and combinations thereof. The metal oxynitrides are preferably selected from aluminum oxynitride, silicon oxynitride, boron oxynitride, and combinations thereof. In unilateral light-emitting devices opaque barrier layers can be used for the non-emitting side of the device. Opaque barrier inorganic materials materials include, but are not limited to, metals, ceramics, polymers, and cermets. Examples of opaque cermets include, but are not limited to, zirconium nitride, titanium nitride, hafnium nitride, tantalum nitride, niobium nitride, tungsten disilicide, titanium diboride, and zirconium diboride.

It is noted that U.S. Pat. No. 7,109,651 discloses an organic electroluminescence cell including at least one organic layer and a pair of electrodes. The organic layer includes a light-emitting layer that is sandwiched between the pair of electrodes. The pair of electrodes include a reflective electrode and a transparent electrode. The organic electroluminescence cell is formed to satisfy the expression; $B_\theta < B_\theta$ in which $B_0$ is a frontal luminance value of luminescence radiated from a light extraction surface to an observer, and $B_\theta$ is a luminance value of the luminescence at an angle of from 50 DEG to 70 DEG. A reflection/refraction angle disturbance region is provided so that the angle of reflection/refraction of the luminescence is disturbed while the luminescence is output from the light-emitting layer to the observer side through the transparent electrode. The organic electroluminescence cell is provided with a region for disturbing the angle of reflection/refraction of light between the light-emitting layer and an output medium on the observer side. In an embodiment the region comprises a dispersion of microdomains. From the point of view of the dispersion/distribution of micro domains, a combination such as brings phase separation is preferred. The dispersion/distribution can be controlled on the basis of mutual solubility of materials combined. The phase separation can be performed by a suitable method such as a method of dissolving mutually insoluble materials in a solvent or a method of mixing mutually insoluble materials while thermally melting the mutually insoluble materials. U.S. Pat. No. 7,109,651 does not recognize that the region can be applied in a barrier structure as a planarizing layer between a first and a second inorganic layer.

BRIEF DESCRIPTION OF THE DRAWINGS

These and other aspects are described in more detail with reference to the drawing. Therein:

FIG. 3A is an EEDX picture according to view III in FIG. 1, FIGS. 4A, 4B and 4C describe a first, a second and a third mode of measurement for measuring outcoupling efficiency of the light-emitting device.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a layer of discrete active regions comprising individual pixels.

Figure 1:
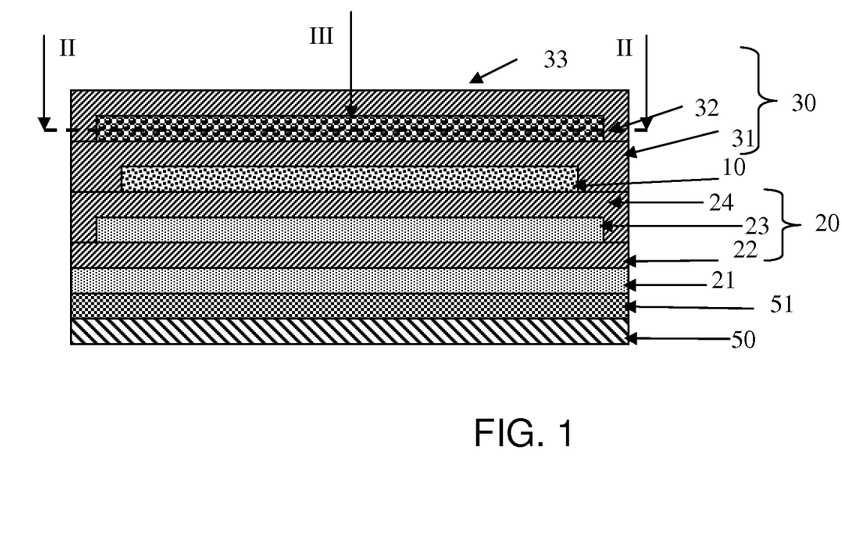
FIG. 1 shows a cross-section through a first embodiment of a light-emitting device according to the first aspect of the present invention.

FIG. 1 shows a light-emitting device comprising an organic light-emitting diode structure 10. The light emitting diode structure 10 is encapsulated by a first and a second barrier structure 20, 30. The light emitting diode structure for example subsequently comprises the following layers an anode formed by an indium tin oxide (ITO) layer having a thickness of about 120 nm, a PEDOT layer having a thickness of about 100 nm, a light emitting polymer layer (LEP) having a thickness of 80 nm and a cathode layer having a barium sub-layer (5 nm) and an aluminium sub-layer (100 nm). The first barrier structure 20 comprises a first inorganic layer 21, an organic layer 22 and a second inorganic layer 23. The second barrier structure 30 comprises a first inorganic layer 31, an organic layer 32 and a second inorganic layer 33. The light-emitting device is mounted via a first and a second intermediate layer 21, 51 at a substrate 50. If desired the substrate may be removed.

The second barrier structure 30 with first inorganic layer 31, organic layer 32 and second inorganic layer 33 of the encapsulation 20, 30 forms a light-transmitting window. The organic layer 32 of the second barrier structure is composed of a dispersion of at least two mutually immiscible organic substances. In this example the inorganic layers 31, 33 have a thickness of 150 nm and are formed of SiN. The organic layer 32 has a thickness of 100 µm.

Figure 2:
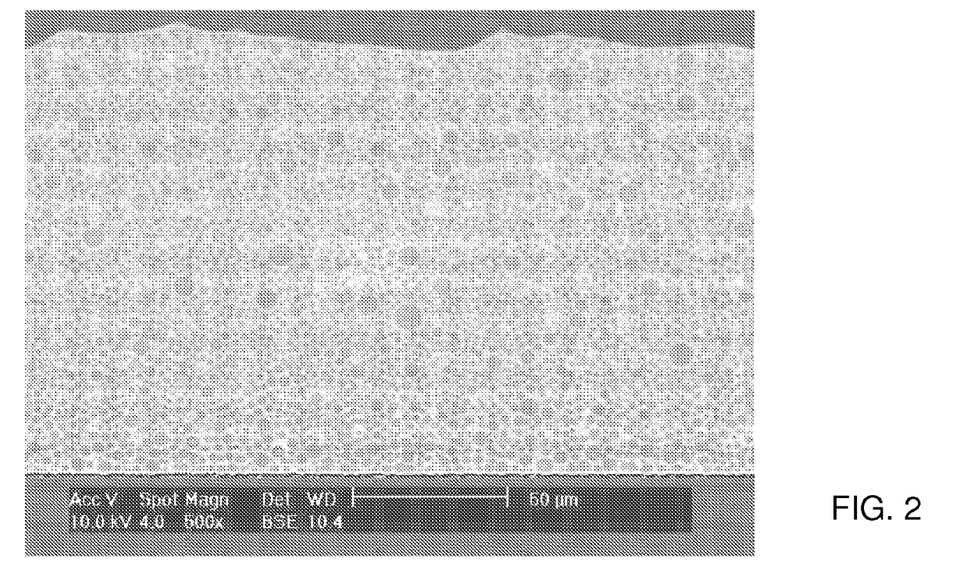
FIG. 2 shows a SEM picture corresponding to a cross-section according to II-II in FIG. 1.

FIG. 2 shows a SEM picture corresponding to a cross-section through the organic layer 32 according to II-II in FIG. 1.

In the embodiment shown the dispersion comprises a mixture of two epoxy silicon resins (90.5 w %) and a cycloaliphatic epoxy resin (7.5 w %). In addition the dispersion comprises 2 w % of photo-initiator. In this composition the two silicon epoxy resins are miscible (they give a clear solution and film), the epoxy resin 1 is not miscible with the cycloaliphatic epoxy (gives a white solution and film) and the epoxy silicon 2 is miscible with the cycloaliphatic epoxy resin (gives a clear solution and film). Suitable materials to produce the organic layer 32 can be found for example in the European patent application 10161452.7.

The transparent organic substances in the organic layer forms micrometer-sized phase-separating domains that have a mutually different refractive index, so that light is refracted at the interfaces between these phase separating domains.

Figure 2A:
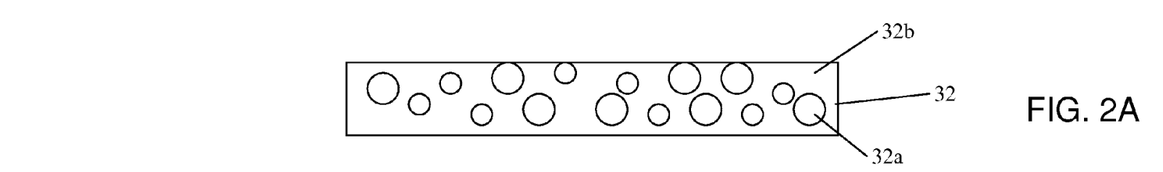
FIG. 2A shows the cross-section according II-II in FIG. 1 more schematically.

As also shown schematically in FIG. 2A, the first and second organic substances form a sea-island structure having an island phase 32a (dark-gray in the picture) and a sea phase 32b (light-grey in the picture).

Figure 3:
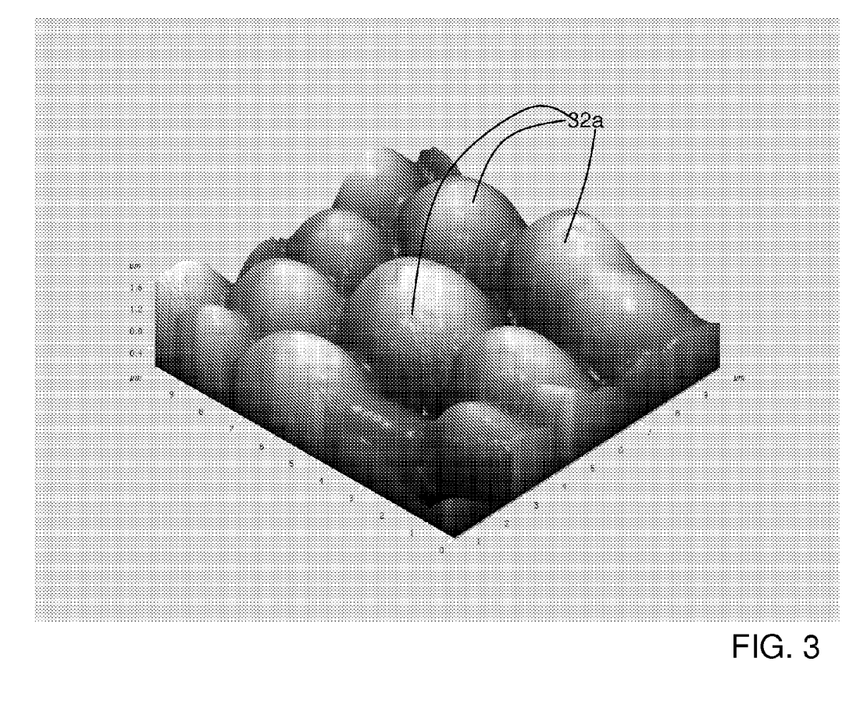
FIG. 3 shows an AFM picture corresponding to a cross-section II-II in FIG. 1.

FIG. 3 shows an AFM-picture of the organic layer 32. In this picture only the island phase 32a is shown. From this picture it becomes clear that the island phase 32a is shaped as lens like elements.

Figure 3A:
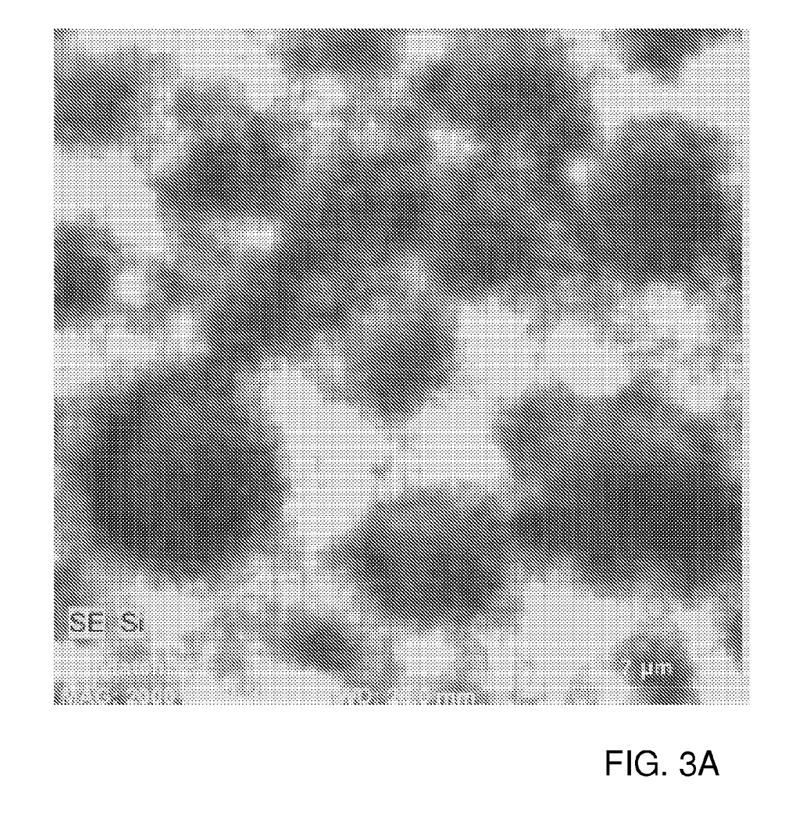

A surface analysis was carried out to determine the composition of the phases in the organic layer. FIG. 3A illustrates the distribution of Si at the surface of the layer. Therein relatively bright zones having a relatively high Si content and relatively dark zones have a relatively low Si content.

A more detailed measurement indicated in mass percent the following distribution of the elements C, O and Si for the island phase (ID1) and the sea-phase (ID2), as shown in the following table.

TABLE 1 distribution of the elements C, O and Si in the phases of the organic layer.

| Spectrum | C | O | Si |
|---|---|---|---|
| ID1 | 54.33 | 29.51 | 16.15 |
| ID2 | 37.38 | 35.25 | 27.36 |

From the table it can be concluded that the sea-phase is relatively Si-rich in comparison to the island phase.

The improvement of a light-output of the light-emitting device provided with an organic layer comprising a dispersion of mutually immiscible transparent organic substances was compared with that of a same light-emitting device without such a layer. The light-output was also compared with that of a light-emitting device having a commercially available light-outcoupling foil provided with micro-lenses.

Figure 4A:
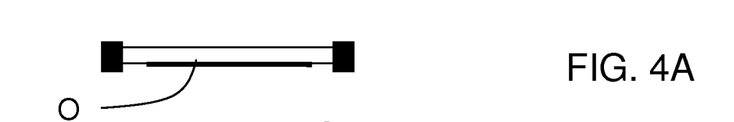
Figure 4B:
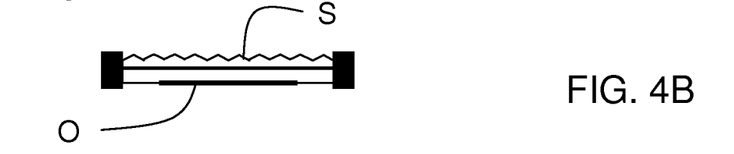
Figure 4C:
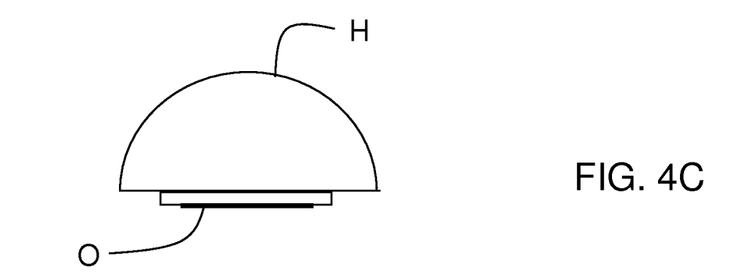

A hybrid white OLED at colour point A (Warm White) with a very good uniformity was used for the tests. The optical output of the white OLED (O) was measured on a special mount in an integrating sphere ISB 500 from Instrument Systems of 50 cm diameter and was analyzed with a CAS 140 B spectrometer. In the planar case only the radiation from the front face of the OLED was taken into account, emission from the sides was blocked. To obtain the light emitted into the substrate a half-sphere macro extractor (diameter 100 mm) was attached to the substrate with an index matching fluid. The measurements were performed at identical currents for all 3 measurement modes of FIG. 4, at a brightness of about 1000 cd/m$^2$ in the planar (blank) case. FIG. 4A shows a planar mode with sides taped. FIG. 4B shows a mode with a surface scattering structure (S), here shown as a corrugated layer, either on glass or directly on the OLED and FIG. 4C shows the measurement with a half-sphere macro-extractor (H). The emitting area of the OLED is 10.65 cm$^2$. The improvement is given as the ratio of the respective luminance to the blank reference without emission to the sides. From this ILO (in %) is derived as the relative difference to the reference. Outcoupling efficiency OE is the percentage coupled into air of light in glass substrate (measured with half sphere macro extractor). The results are shown in Table 2.

TABLE 2

Measurement results

| Out-coupling structures | Improvement (ILO) | Outcoupling efficiency OE |
|---|---|---|
| Plane, sides closed* | Ref.: 0% | 52.3% |
| Half sphere macro extractor | +91.2% | 100% |
| JB2-10B, with sugar water | +33.0% | 69.6% |
| JB2-10B, with Cargille n = 1.53 | +39.2% | 72.8% |
| JB2-10B with 3M glue on glass 0.7 mm on Cargille fluid | +30.8%, | 68.4% |
| JB2-10B, with 3M glue on glass + Cargille fl., sides open | +37.3% | 71.8% |
| BIC micro-lens array*, Cargille fl. | +40.4%, | 73.5% |

In this measurement a foil denoted as JB2-10B is used having the same composition as the organic layer in the second barrier structure of the device according to the invention was optically attached either with sugar water (n=1.4, but birefringent) or with an index matching fluid Cargille Series A; n=1.53; Also a double-sided adhesive foil from 3M was used, but on top of a float glass plate of 0.7 mm thickness. As can be seen in the table the output efficiency of the OLED provided with the foil JB2-10B is significantly improved to about 70% as compared to the output efficiency (52.3%) of the reference situation. The output efficiency so obtained is comparable to that for the commercially available outcouple foil that uses micro-lenses.

FIGS. 5A to 5L describe a possible method of manufacturing a device according to the invention.

Figure 5A:
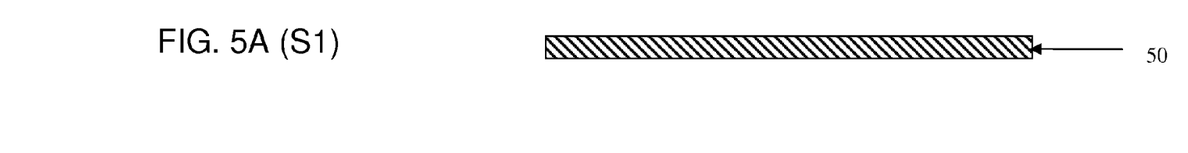
FIGS. 5A to 5L show an embodiment of a method according to a second aspect of the present invention.

In step S1, illustrated in FIG. 5A a substrate 50 is provided. According to the invention the substrate is made of an inorganic material. The inorganic material may comprise e.g. a ceramic material, a glass or a metal.

Figure 5B:
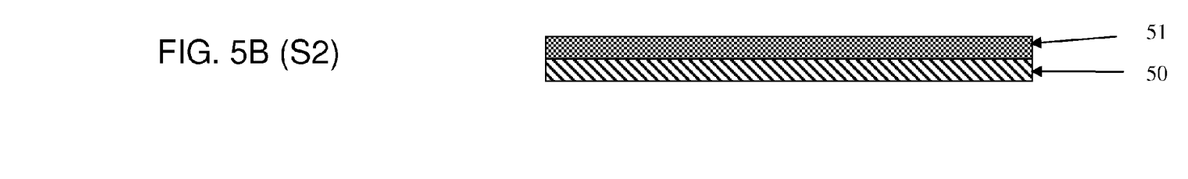

In step 5B a release layer 51 is applied on the substrate 50. The methods described above for applying an organic layer are suitable for this purpose.

The release layer 51 may comprise a silica organic based polymer such as polydimethylsiloxane (PDMS), but may alternatively comprise another component that provides for a sufficient adhesion of the workpiece to the substrate 50 during manufacturing, but that allows an easy release of the workpiece once finished. Surprisingly, also materials used in the active layers of OLED devices, like PEDOT and LEP turned out to be suitable for this purpose. At release of the finished product from the substrate 50, the release layer 51 may stay with the product, or may stay with the substrate 50. If the release layer 51 stays with the substrate 50 it may be reused or removed.

Figure 5C:
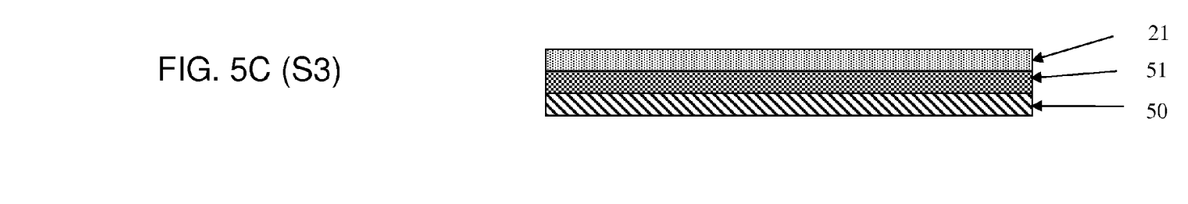
Figure 5D:
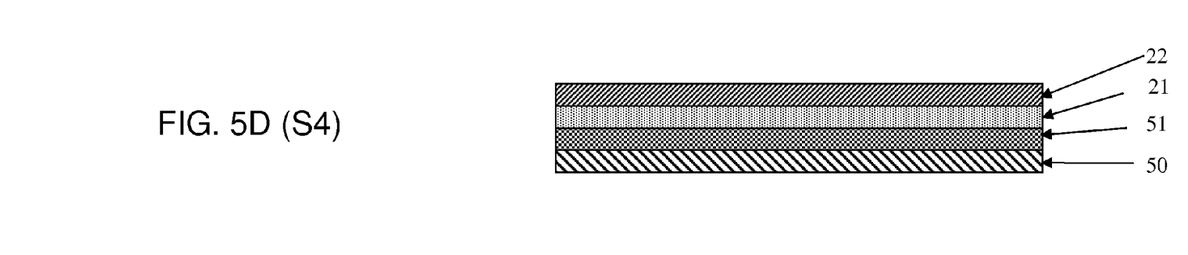
Figure 5E:
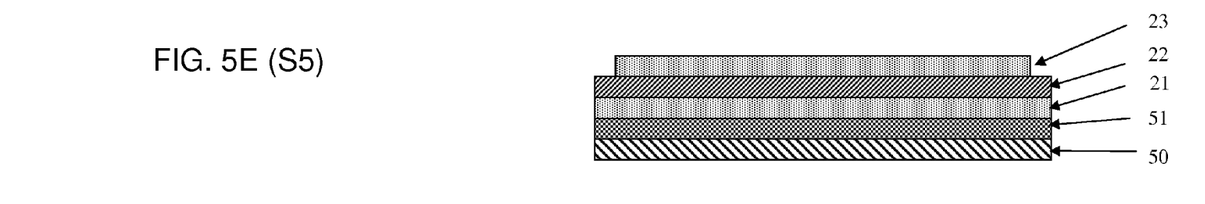
Figure 5F:
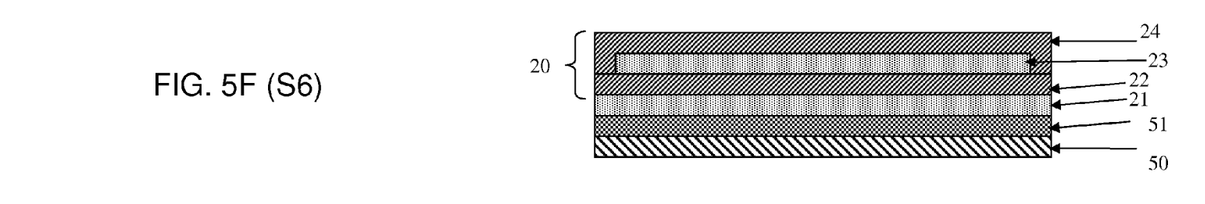

In steps S3 to S5 shown in FIGS. 5D to 5F respectively, a first barrier structure 20, comprising layers 21, 22, 23, is applied at the release layer 51. In the embodiment shown these steps comprise:

Step S4, shown in FIG. 5D, wherein a first inorganic layer 22 is applied,

Step S5, shown in FIG. 5E, wherein a first organic layer 23 is applied at the first inorganic layer 22, and Step S6, shown in FIG. 5F wherein a second inorganic layer 24 is applied at the first organic layer 23.

In this case step S4 is preceded by an additional step S3, shown in FIG. 5C, wherein an additional organic layer 21 is applied at the release layer 51, so that the first inorganic layer 22 is applied at the additional organic layer 21.

Figure 5G:
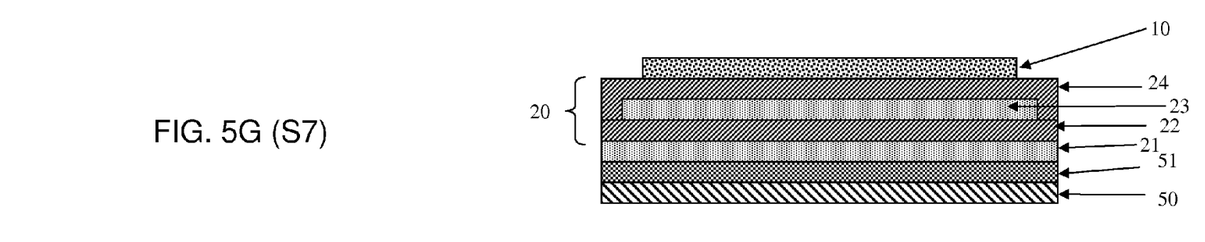

In step S7, shown in FIG. 5G, an organic light emitting diode 10 is constructed. The construction thereof is well known as such to the skilled person, and is therefore not described in detail here.

In steps S8 to S11 a second barrier structure 30 is applied on top of the organic thin film electronic device.

Figure 5H:
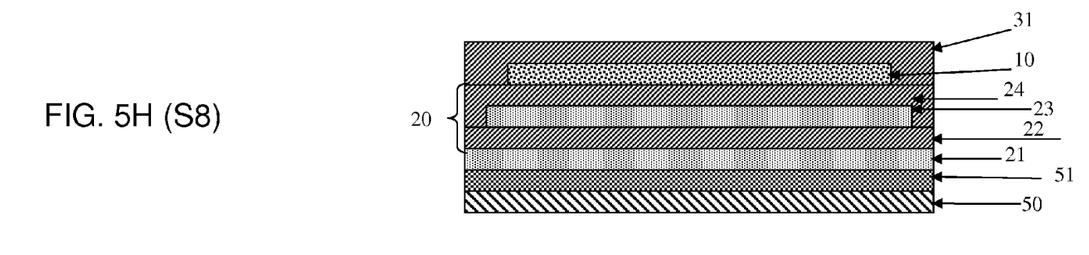
Figure 5I:
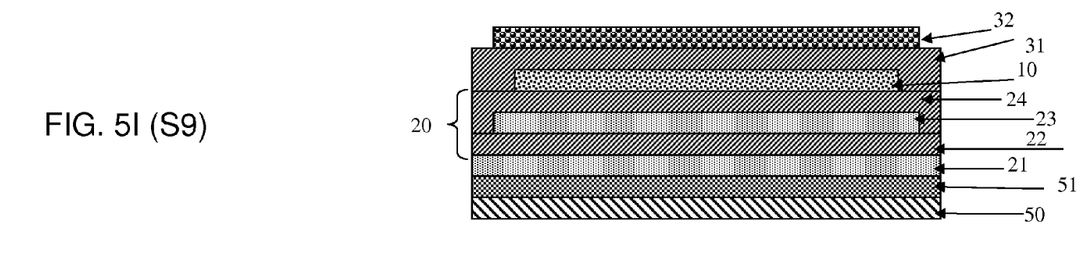

These steps comprise:

Step S8, shown in FIG. 5H, wherein a third inorganic layer 31 is applied,

Step S9, shown in FIG. 5I, wherein a second organic layer 32 is applied at the third inorganic layer 31. The second organic layer 32 is applied as a dispersion of a first and a second mutually immiscible transparent organic substance. In this dispersion the first transparent organic substance comprises a mixture of two epoxy silicon resins (90.5 w %) and the second transparent organic substance is an cycloaliphatic expoxy resin (7.5 w %). In addition the dispersion comprises 2 w % of photo-initiator. The components were mixed simultaneously by stirring with a magnetic stirrer (Heidolph MR Hei-End) at 500 rpm for about 10 min. Subsequently the formulation was applied on a bar-coater (RK Control coater) using a plastic pipet, and then applied as a film using the 100 micrometers wire bar. After stirring the island phase 32a having a relatively low silicon content is finely distributed within the sea phase 32b having a relatively high silicon content. The finely distributed island phase 32a forms microlenses having a diameter in the range of 1 to 10 µm. By stirring for a longer time a finer distribution is obtained. Stirring for a shorter time results in a courser distribution.

Figure 5J:
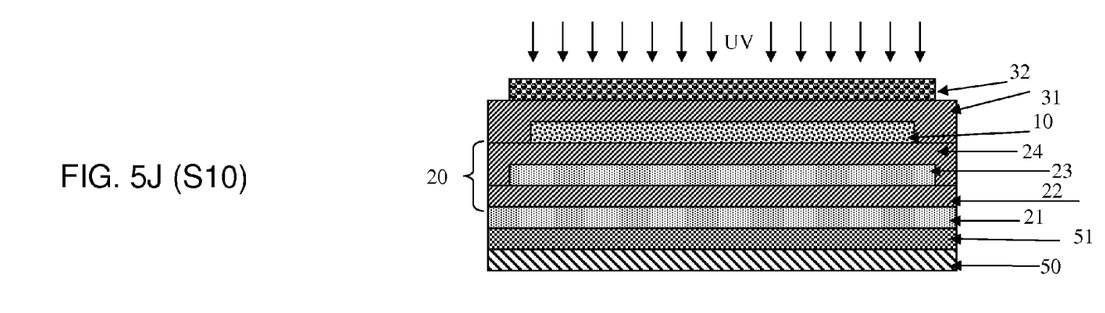

As shown in FIG. 5J, in a next step S10 the organic layer 32 so applied is cured by radiation with an UVA-source providing a radiation dose of 3 J/cm$^2$.

Figure 5K:
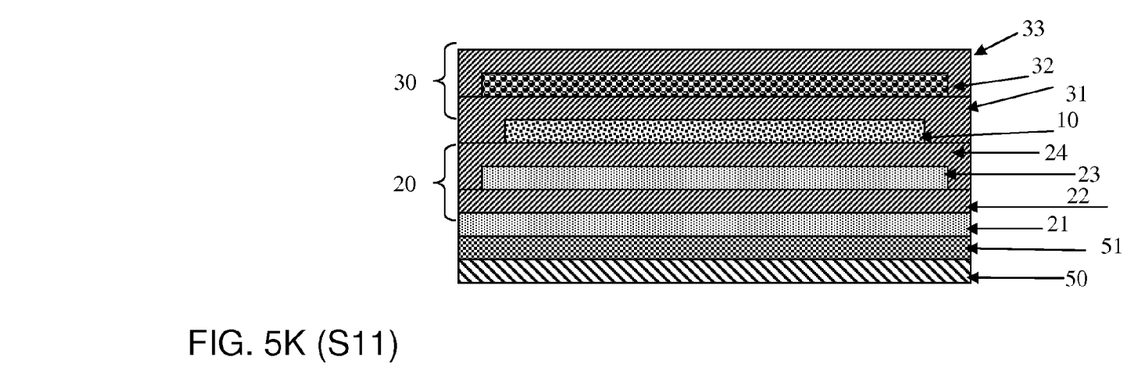

In Step S11, shown in FIG. 5K, a fourth inorganic layer 33 is applied at the first organic layer 32.

Figure 5L:
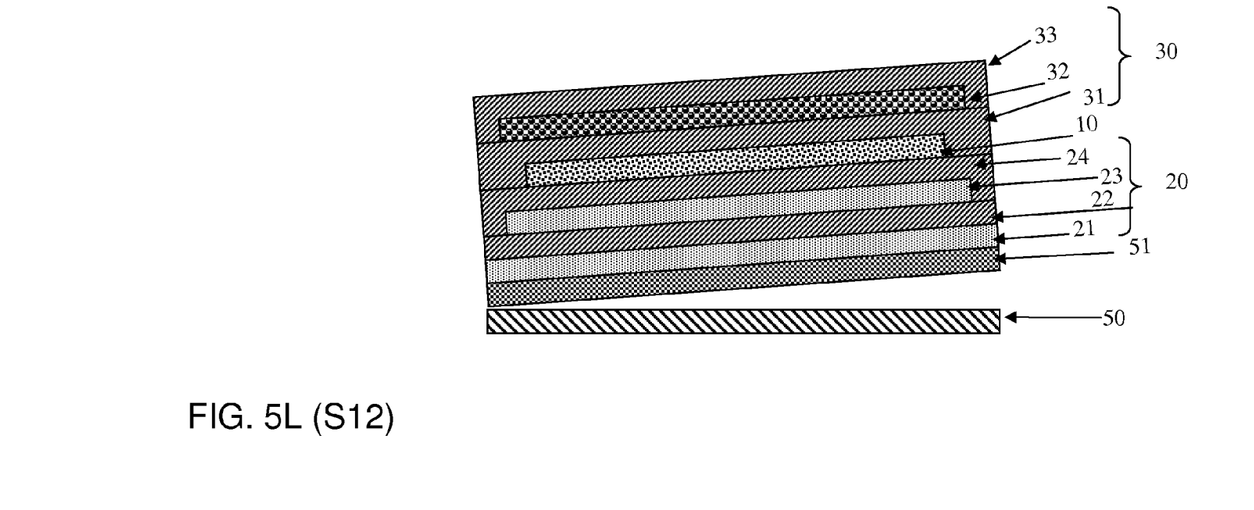

In a subsequent step S12, shown in FIG. 2L, the product formed in the previous steps is released from the substrate 50. Therewith an encapsulated electronic device as shown in FIG. 1 is obtained. As shown in FIG. 1A more devices may be constructed on a single substrate 50.

In the above-described method of manufacturing the inorganic layers may be applied by all kinds of physical vapour deposition methods such as thermal evaporation, e-beam evaporation, sputtering, magnetron sputtering, reactive sputtering, reactive evaporation, etc. and all kinds of chemical vapour deposition methods such as thermal chemical vapour deposition (CVD), photo assisted chemical vapour deposition (PACVD), plasma enhanced chemical vapour deposition (PECVD), etc.

The organic layers may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc. Also the second organic layer 32 comprising a dispersion of mutually immiscible transparent organic substances may be applied by one of these methods. It is therewith an advantage that the dispersion comprises no solid particles, so that sedimentation of components in the organic substance is counteracted.

For clarity it is not illustrated in the figures how the electronic device 10 is electrically connected to external conductors. Preferably the electrical conductors to the electronic device are provided as an aluminum conductor with a molybdenum coating between subsequent inorganic layers 24, 21 for example. The molybdenum coating therein serves as an adhesion layer. This step of applying the electrical conductors can be applied between step S7 and S8 according to the method described above. In an alternative embodiment electrical connection to outside conductors is provided later, e.g. after step 2K. This is possible by punching respective holes through at least one of the barrier layers towards electrical connectors of the electronic device and filling these holes with a conductive material.

Although in the embodiment shown the light-emitting device is released from the substrate 50 it is in another embodiment possible to maintain the light-emitting device to the substrate. In that case the release layer 51 may be omitted. Also the additional organic layer 21 may be omitted. In an embodiment the first barrier structure 20 alternatively or additionally is provided with an organic layer 23 comprising a dispersion of mutually immiscible transparent organic substances. In again another embodiment the barrier structure 20 is replaced by a metal foil or a glass plate for example.

It is not necessary that the light-emitting structure is provided first. In an embodiment first the light-transmitting window is provided and the light-emitting structure is applied at the light-transmitting window.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention claimed is:

1. A light-emitting device comprising
an organic light-emitting diode structure,
an encapsulation comprising a light-transmitting window with at least a first inorganic layer, an organic layer and a second inorganic layer, the organic layer comprising domains of a dispersed first organic component embedded by a second organic component, the first organic component and the second organic component having a mutually different refractive index, the organic layer being sandwiched between the first and the second inorganic layer.

2. The light-emitting device according to claim 1, wherein the domains forms lens-like elements.

3. The light-emitting device according to claim 2, wherein the lens-like elements substantially have a diameter in the range of 0.5 to 20 µm.

4. The light-emitting device according to claim 1, wherein the organic layer has a thickness between 5 and 100 µm.

5. The light-emitting device according to claim 1, wherein the inorganic layers have a thickness in the range of 10 to 1000 nm.

6. The light-emitting device according to claim 5, wherein the inorganic layers have a thickness in the range of 100 to 300 nm.

7. The light-emitting device, according to claim 1, wherein the organic layer comprises the following organic substances:
a polymerized substance A selected from (meth)acrylates, epoxys, oxetanes a polymerized substance B selected from silicon (meth)
acrylates, silicon epoxies, fluorinated (meth)acrylates,
fluorinated epoxies, preferentially silicon epoxies.

* * * * *